(12) United States Patent
Lojek

(10) Patent No.: US 7,183,180 B2
(45) Date of Patent: Feb. 27, 2007

(54) METHOD FOR SIMULTANEOUS FABRICATION OF A NANOCRYSTAL AND NON-NANOCRYSTAL DEVICE

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 290 days.

(21) Appl. No.: 10/966,976

(22) Filed: Oct. 13, 2004

(65) Prior Publication Data

US 2006/0076606 A1    Apr. 13, 2006

(51) Int. Cl.
*H01L 21/20* (2006.01)

(52) U.S. Cl. ...................... 438/486; 977/701
(58) Field of Classification Search ........... 438/486, 438/797, 489, 488, 799; 977/700, 701, 707, 977/737, 778, 779, 780, 790, 810
See application file for complete search history.

(56) References Cited

U.S. PATENT DOCUMENTS

| | | | |
|---|---|---|---|
| 4,963,505 A * | 10/1990 | Fujii et al. ................ | 438/405 |
| 5,994,164 A * | 11/1999 | Fonash et al. ............. | 438/97 |
| 6,140,181 A * | 10/2000 | Forbes et al. ............. | 438/257 |
| 6,190,949 B1 * | 2/2001 | Noguchi et al. ........... | 438/149 |
| 6,545,324 B2 * | 4/2003 | Madhukar et al. ......... | 257/371 |
| 6,690,059 B1 * | 2/2004 | Lojek ....................... | 257/316 |
| 6,897,151 B2 * | 5/2005 | Winter et al. ............. | 438/687 |
| 2003/0132500 A1 | 7/2003 | Jones, Jr. et al. ......... | 257/500 |

* cited by examiner

*Primary Examiner*—W. David Coleman
(74) *Attorney, Agent, or Firm*—Schneck & Schneck; Thomas Schneck

(57) ABSTRACT

A method of simultaneously fabricating at least two semiconductor devices, at least one of which is a nanocrystal memory and at least one of which is a non-nonocrystal semiconductor device. A nanocrystal layer is formed over an oxide layer of the at least two semiconductor devices being fabricated. The nanocrystal layer is removed from at least one portion of the substrate corresponding to the at least one non-nanocrystal device being fabricated. A polycrystalline gate is formed for each of the semiconductor devices being fabricated. Doping is provided to provide the source and drain regions for each of the semiconductor devices being fabricated. The substrate is thermally treated after the doping. The thermal budget of the fabrication process is not limited by this thermal treatment.

25 Claims, 14 Drawing Sheets

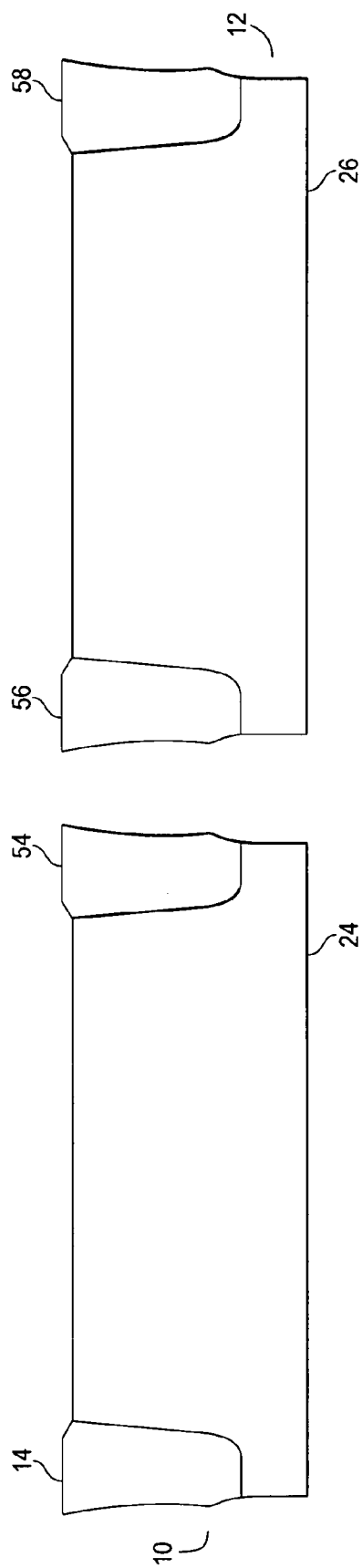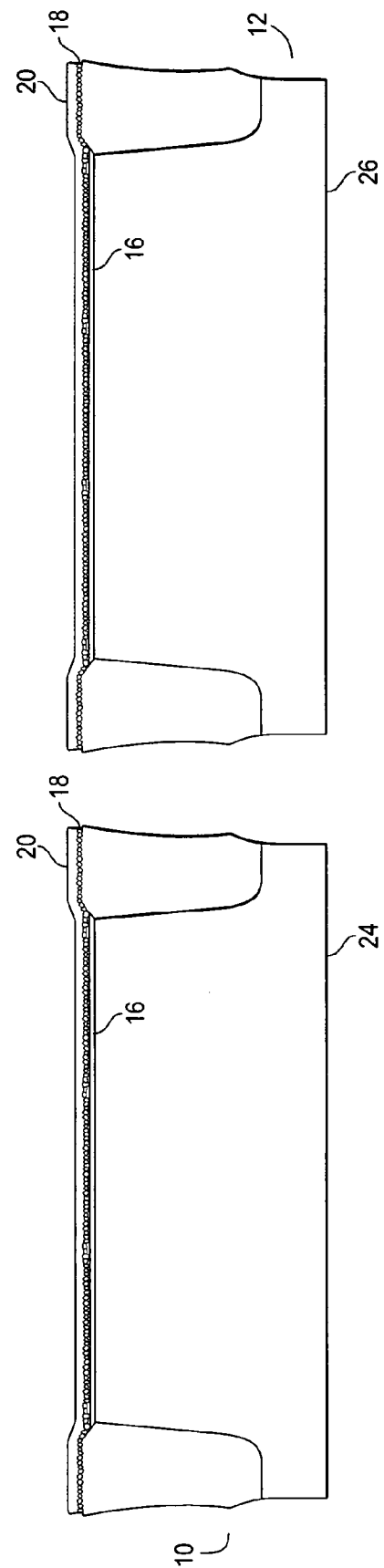

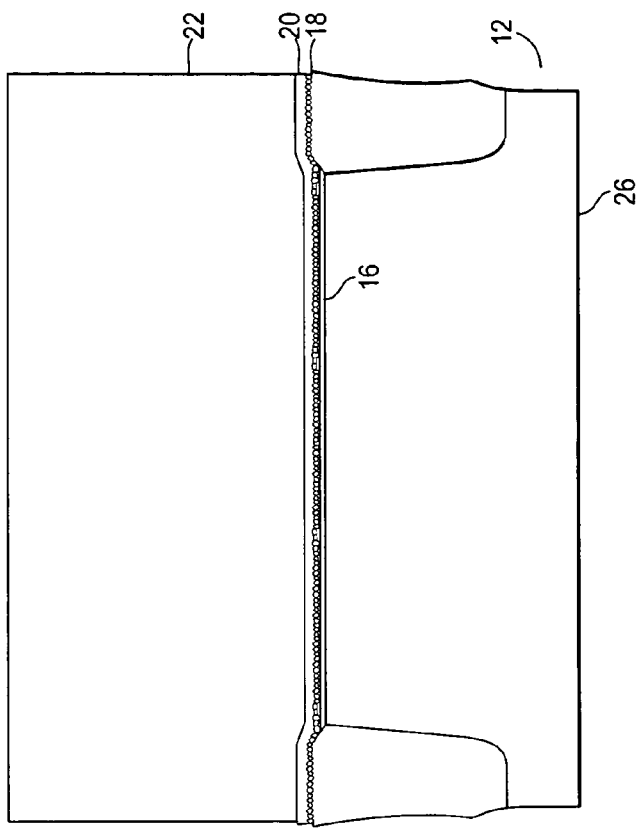
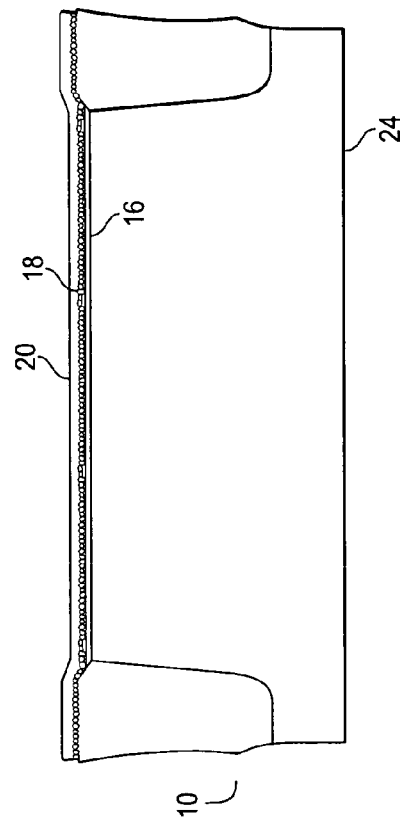
Fig. 3a
Fig. 3b

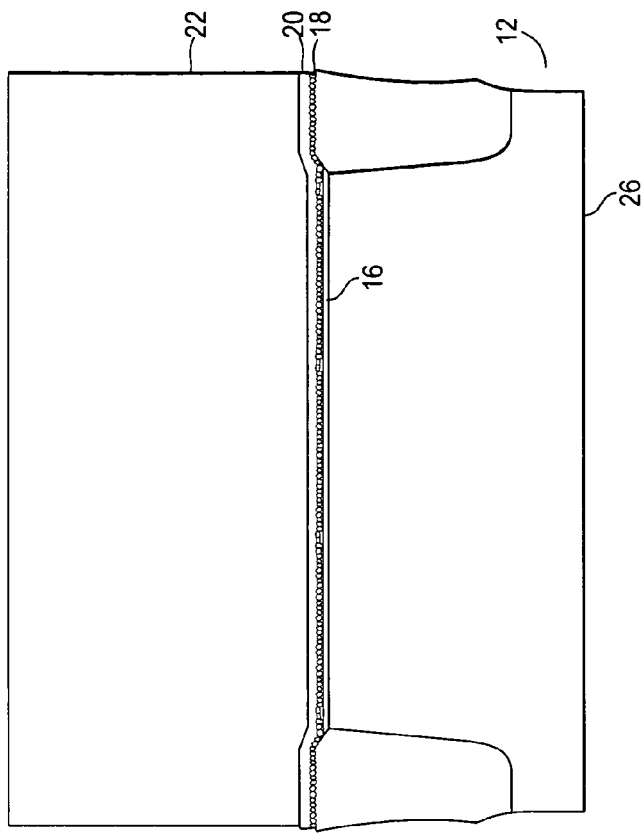
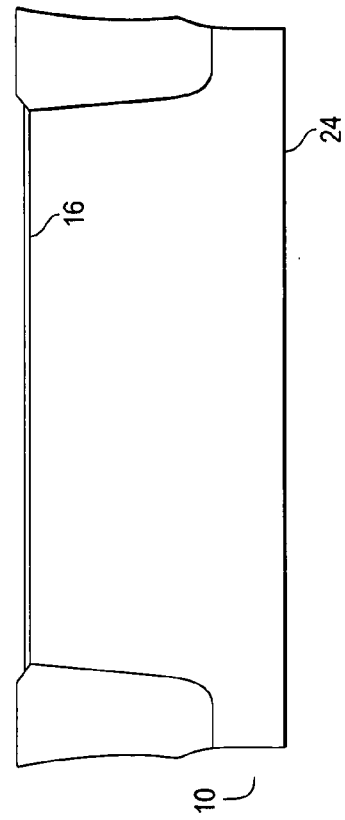

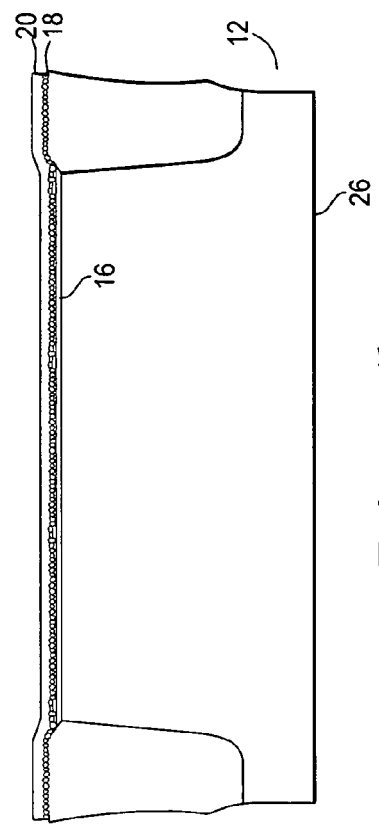
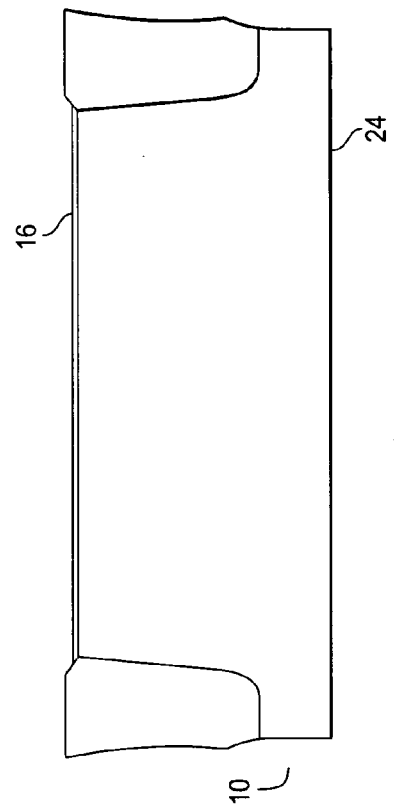

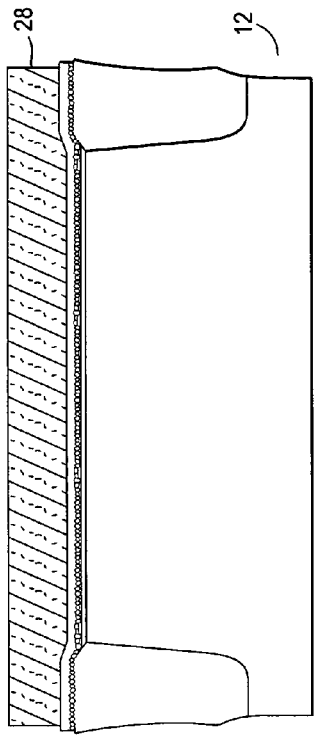
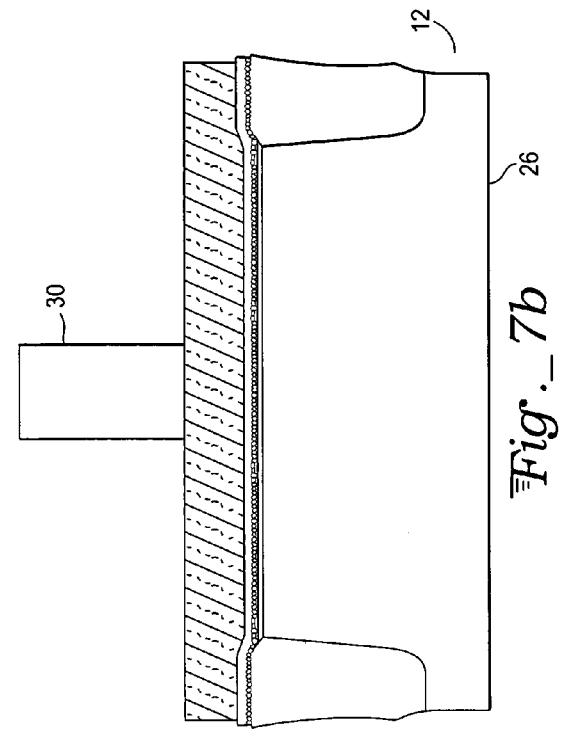
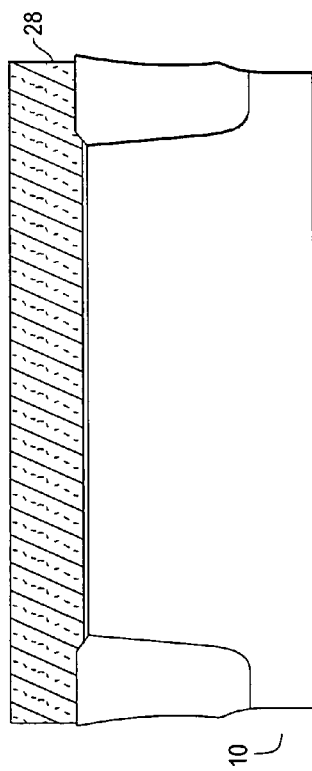
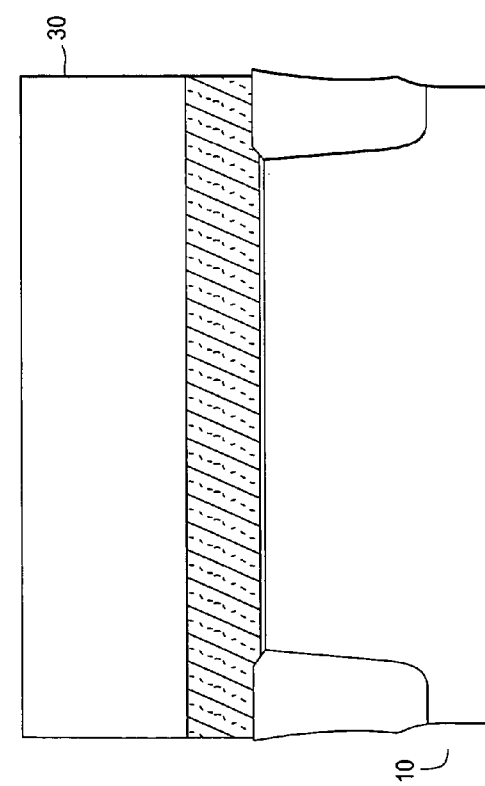

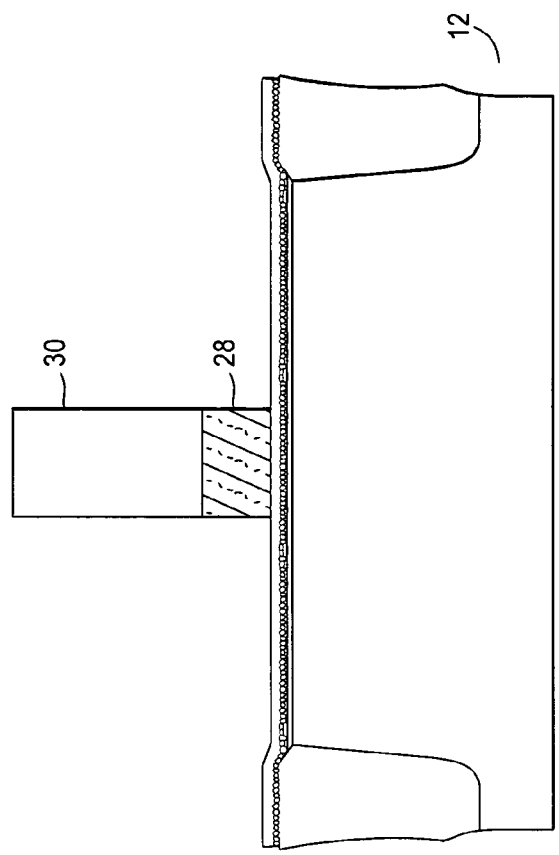
Fig._8b
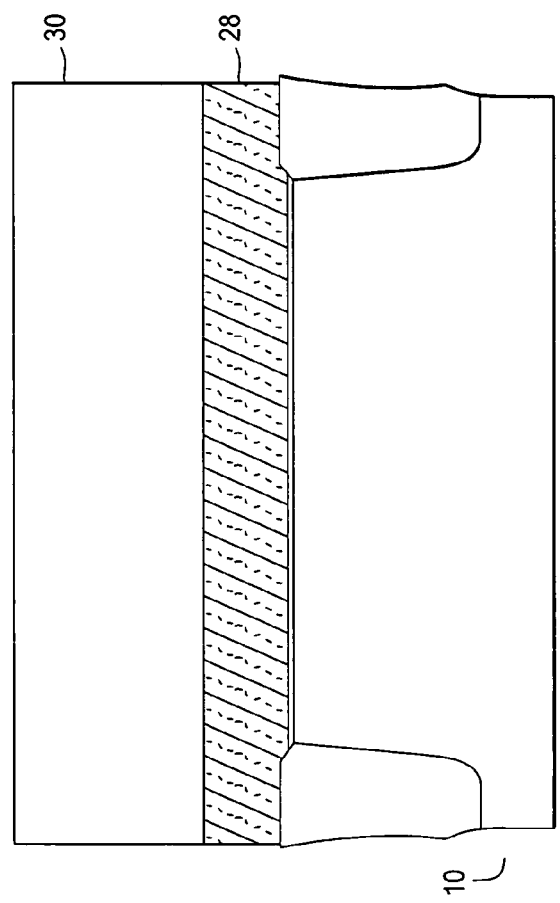
Fig._8a

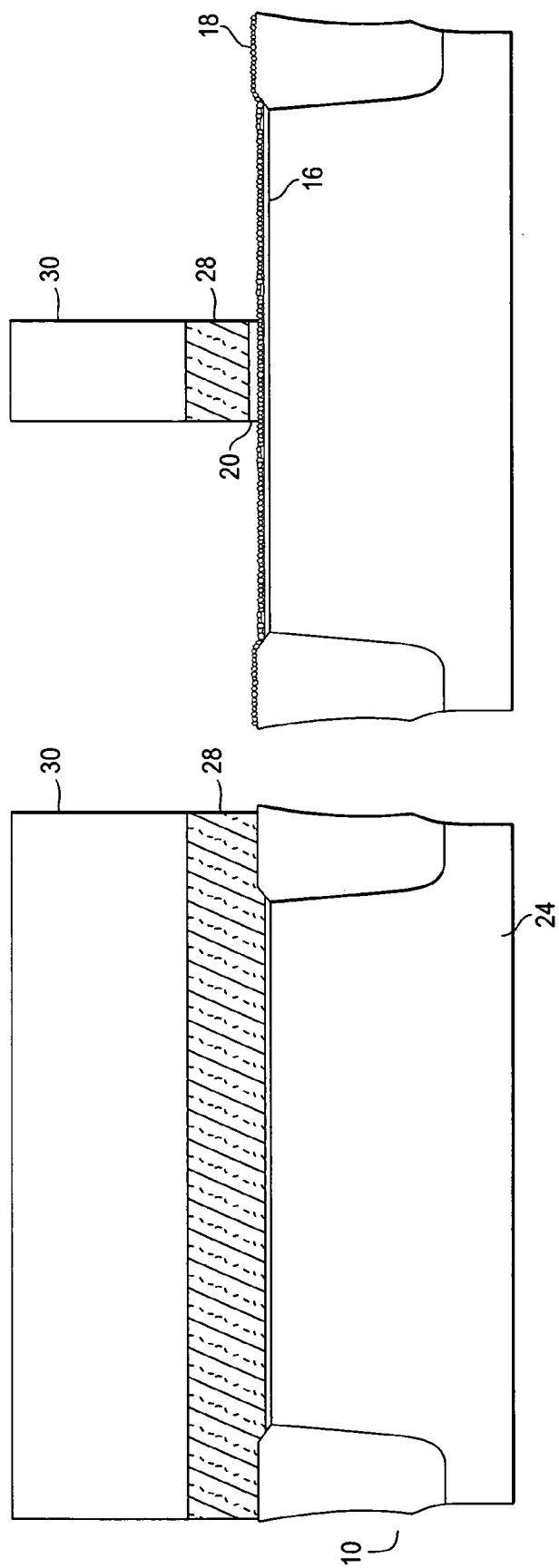
Fig._9a
Fig._9b

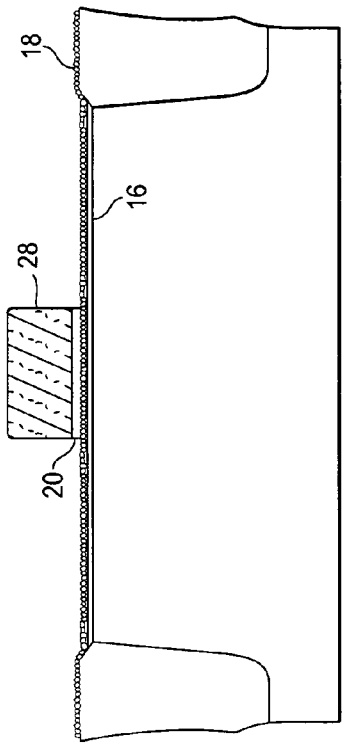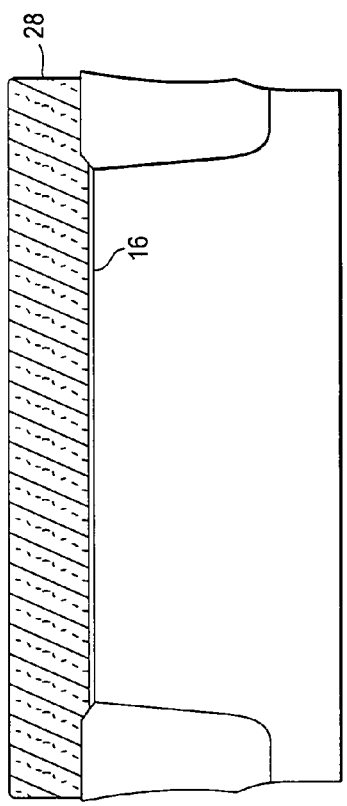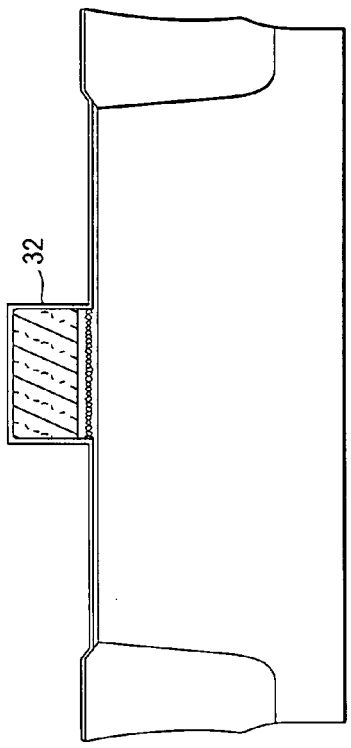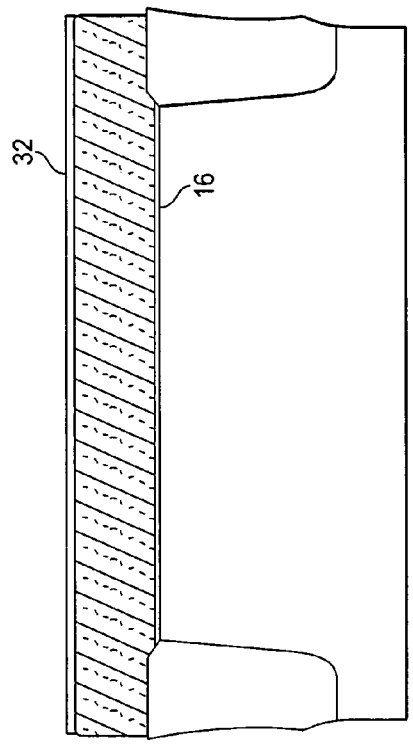

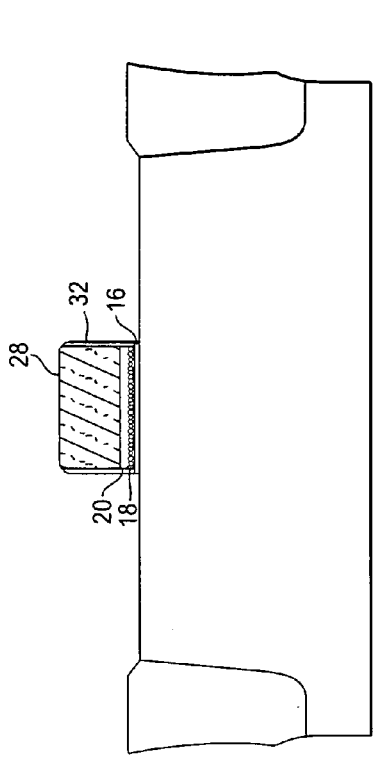
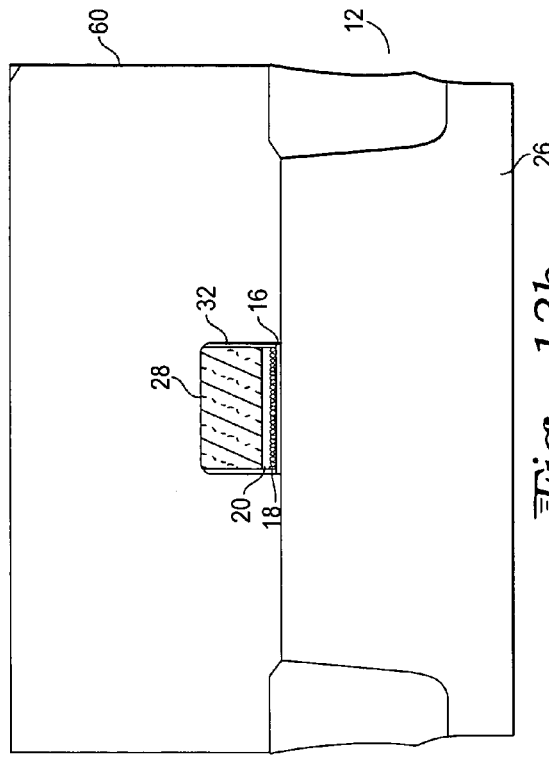
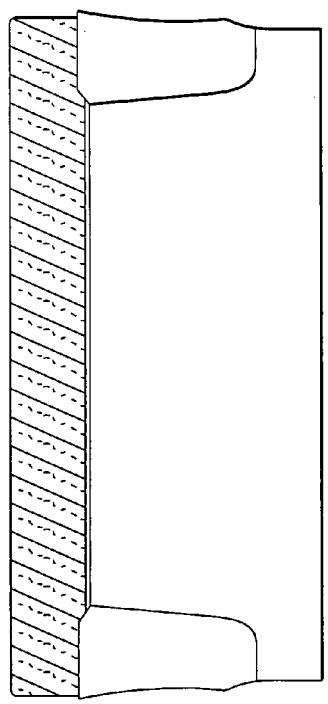
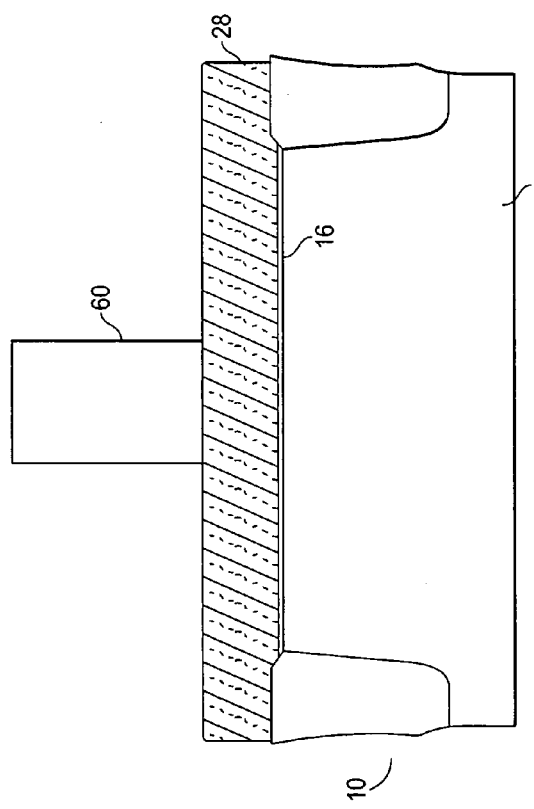

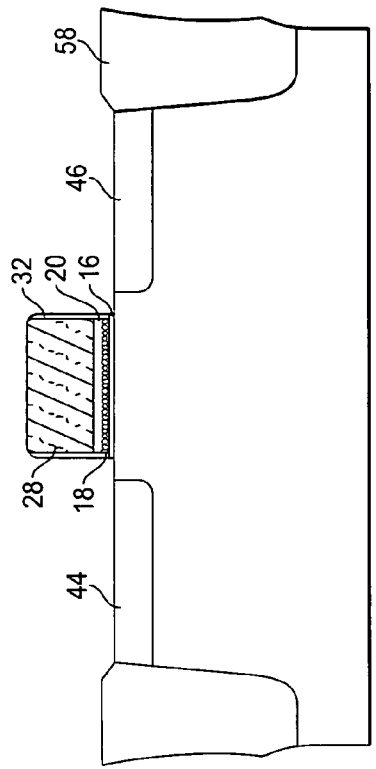
Fig._19a
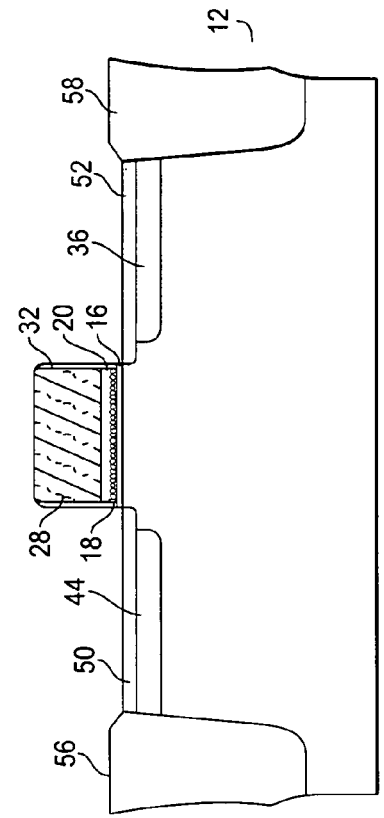
Fig._19b
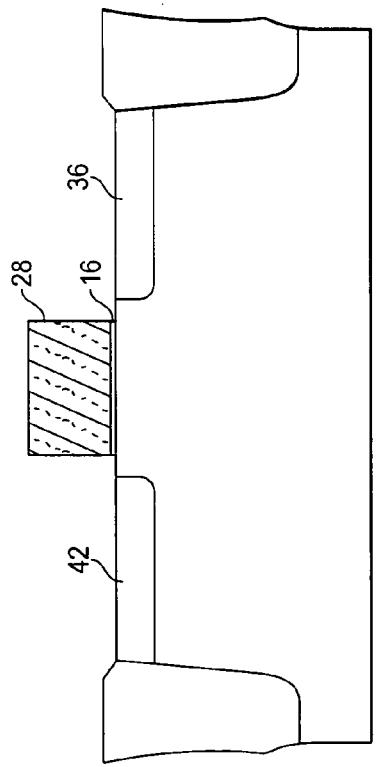
Fig._20a
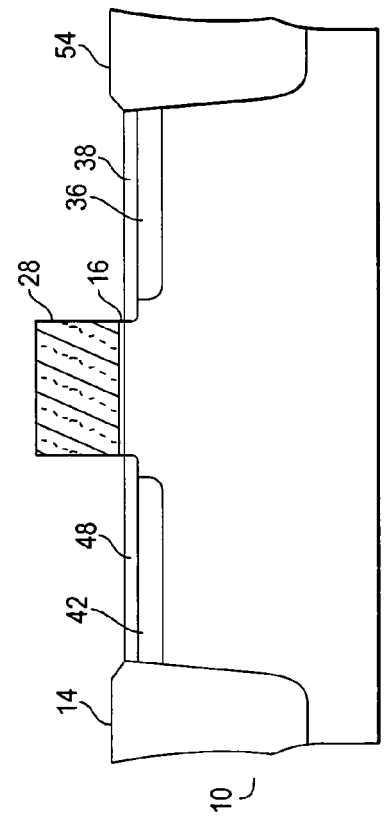
Fig._20b

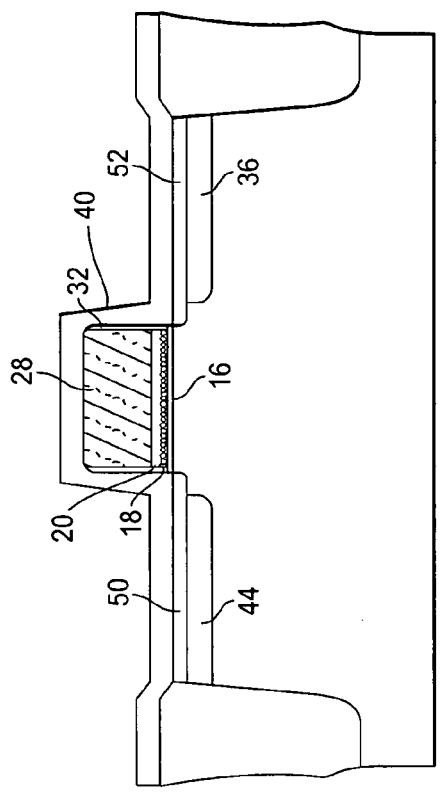
*Fig._21a*
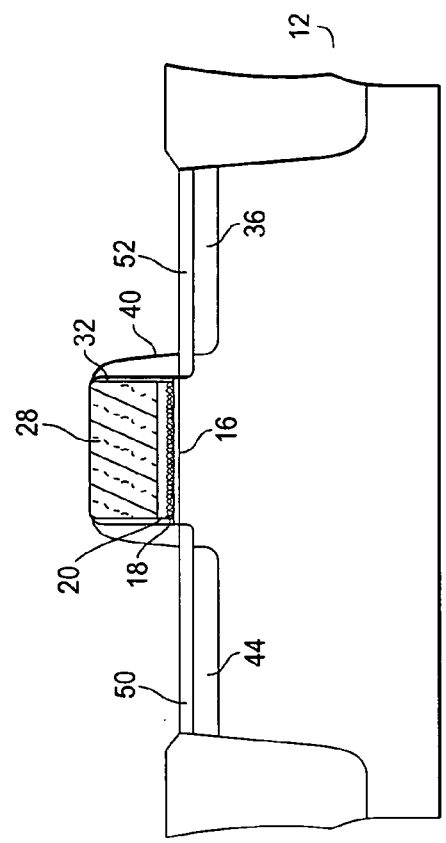
*Fig._21b*
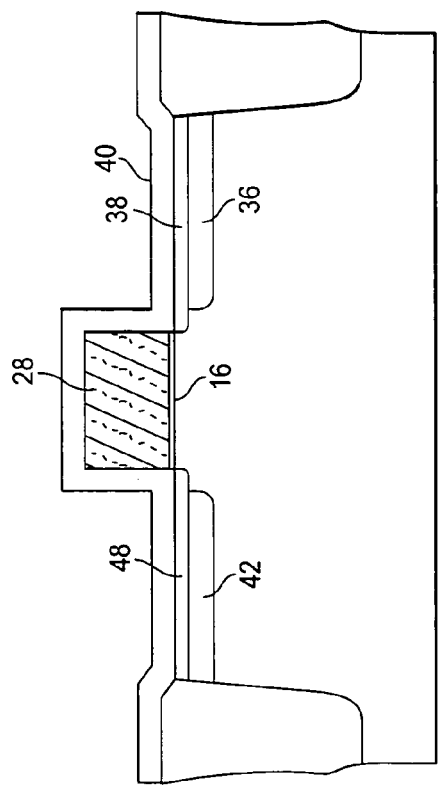
*Fig._22a*
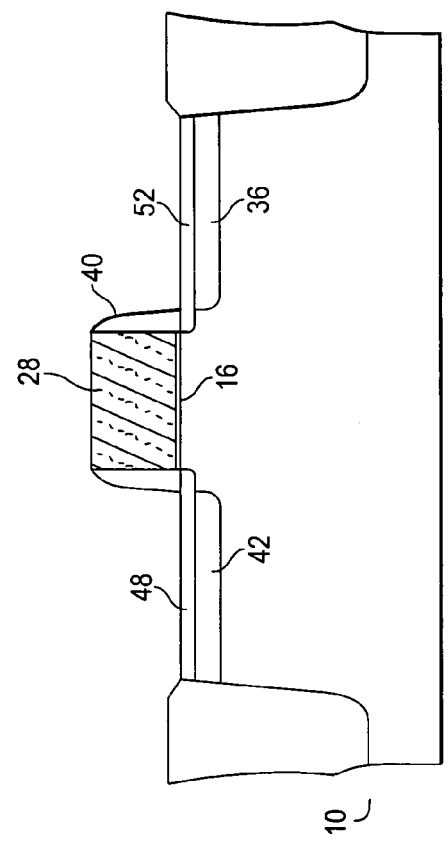
*Fig._22b*

METHOD FOR SIMULTANEOUS FABRICATION OF A NANOCRYSTAL AND NON-NANOCRYSTAL DEVICE

FIELD OF THE INVENTION

This invention relates to semiconductor device fabrication, in particular, simultaneous fabrication of nanocrystal and non-nanocrystal devices.

BACKGROUND OF THE INVENTION

Nanocrystals are known to effectively store small amounts of electric charge in microscopic metal or semiconductor particles involving only a few atoms. Nanocrystal devices may be exceedingly small since the charge storage structures have nanometer size.

Fabrication of nanocrystal devices usually requires that the thermal temperature of processing or annealing steps be as low as possible since high temperatures may cause increased dopant diffusion that adversely affects the performance of the fabricated device. Therefore, it would be advantageous to provide a fabrication flow for simultaneous fabrication of nanocrystal devices and non-nanocrystal devices where the subsequent thermal treatment will not alter properties of nanocrystals.

SUMMARY OF THE INVENTION

In one embodiment of the invention, a method of simultaneously fabricating two semiconductor devices, at least one of which is a nanocrystal device and at least one of which is a non-nanocrystal device, comprises forming a first thermal oxide layer for at least two semiconductor devices being fabricated on at least two portions of a surface of a substrate, forming a nanocrystal layer over the oxide layer of the at least two semiconductor devices being fabricated, removing with an etching process the nanocrystal layer from the at least one portion of the substrate corresponding to the at least one non-nanocrystal device being fabricated, forming a polycrystalline gate for each of the at least two semiconductor devices being fabricated, the exposed nanocrystals not covered by the gate on the at least one portion of the substrate associated with the at least one nanocrystal device consumed by a thermal oxidation process, the thermal oxidation process producing a second thermal oxide, a remaining plurality of nanocrystals forming a floating gate, providing doping in selected areas of the substrate to form source and drain regions for the at least two semiconductor devices being fabricated, thermally treating the substrate following the doping, the thermal treatment not limiting a thermal budget of the fabrication process. A CMOS transistor may be formed in this fashion in one embodiment of the invention.

In another embodiment of the invention, method for simultaneously fabricating two semiconductor devices, at least one of which is a nanocrystal device and at least one of which is a non-nanocrystal device, comprises forming a first thermal oxide layer for at least two semiconductor devices being fabricated on at least two portions of a surface of a substrate, forming a nanocrystal layer over the oxide layer of the at least two semiconductor devices being fabricated, masking at least one portion of the substrate associated with the at least one nanocrystal device being fabricated to protect underlying layers while performing fabrication processes for the at least non-nanocrystal device being fabricated, said fabrication processes including removing with an etching process the nanocrystal layer from the at least one portion of the substrate corresponding to the at least one non-nanocrystal device being fabricated, forming a polycrystalline gate for each of the at least two semiconductor devices being fabricated, the exposed nanocrystals not covered by the gate on the at least one portion of the substrate associated with the at least one nanocrystal device consumed by a thermal oxidation process, the thermal oxidation process producing a second thermal oxide, a remaining plurality of nanocrystals forming a floating gate, providing doping in selected areas of the substrate to form source and drain regions for the at least two semiconductor devices being fabricated, and thermally treating the substrate following the doping, the thermal treatment not limiting a thermal budget of the fabrication process. A CMOS transistor may be formed in one embodiment of the invention.

BRIEF DESCRIPTION OF THE DRAWINGS

FIGS. 1a and 1b are cross sections of a semiconductor wafer at a starting point of an embodiment of the invention.

FIGS. 2a–22a are cross sections of semiconductor peripheral device structures at selected processing stages according to an embodiment of the invention.

FIGS. 2b–22b are cross sections of semiconductor memory device structures at selected processing stages according to an embodiment of the invention.

DETAILED DESCRIPTION OF THE INVENTION

Figure 14B:
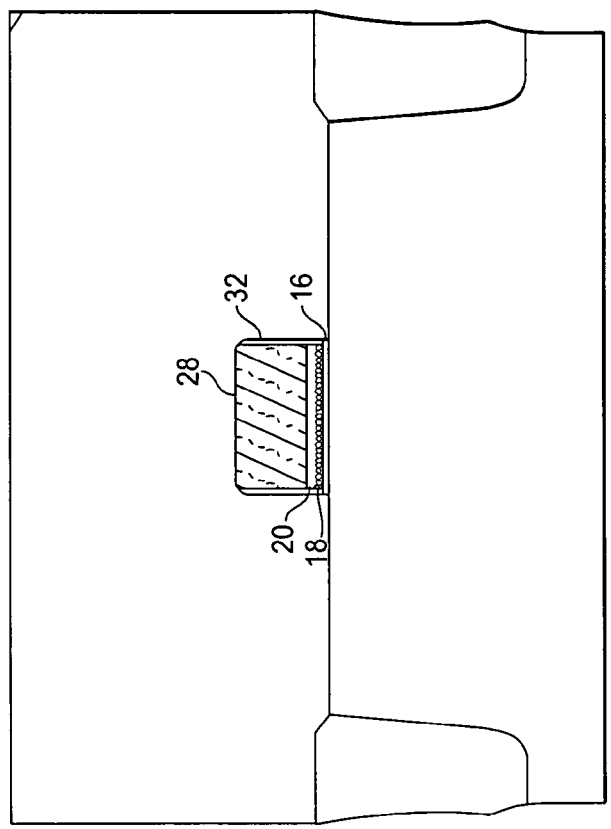

A process for simultaneously fabricating a semiconductor device, such as a memory cell, containing a nanocrystal layer as well as a peripheral semiconductor device (in one embodiment, forming CMOS transistor) that does not contain a nanocyrstal layer is described below. With reference to FIGS. 1a–22a, exemplary process steps provide detail for fabrication of a peripheral device that does not contain nanocrystals while FIGS. 1b–22b provide detail for an exemplary fabrication of a memory cell containing nanocyrstals.

In FIGS. 1a and 1b, a semicondcutor substrate, for example, p-type silicon, is provided. Assuming two semiconductor devices, a peripheral semiconductor device without nanocyrstals (FIG. 1a) and a memory cell with nanocrystals (FIG. 1b) are to be fabricated simultaneously on the substrate, both a portion 10 of the substrate 24 corresponding to the to-be fabricated peripheral device and a portion 12 of the substrate 26 corresponding to the memory cell with nanocyrstals are doped in the usual way for formation of a MOS or CMOS EEPROM device. Shallow trench isolation ("STI") regions 14, 54, 56, and 58, well known in the art, are implanted within the relevant portions 24, 26 of the substrate to define the active area of the devices. Other isolation methods may be employed in other embodiments. Before layers are formed on the substrate, the surface of the substrate is prepared in the usual way by, for example, a chemical mechanical planarization ("CMP") polishing.

In FIGS. 2a and 2b, a layer of thermal oxide 16 (such as tunnel or gate oxide) having a target thickness of about 60 Å is deposited. Before a nanocrystal layer is deposited, oxide surface hydroxylation is performed after the oxide surface is etched to less than 20 Å by exposing the oxide to 0.05% hydrofluoric acid for 300 seconds.

The nanocrystal layer 18 with nanocrystals approximately 40 Å in diameter is then formed. In one embodiment, the nanocrystal layer is formed by CVD deposition of an insulating layer such as oxide, nitride, or oxynitride. Silicon atoms may be implanted into this dielectric material. This layer is annealed to further improve properties of silicon nanocrystals. This thermal processing step does not limit the thermal budget of further fabrication processes because other semiconductor devices which are usually compromised by dopant diffusion are not in place. (Other methods of nanocrystal formation known in the art may also be used.)

After the nanocrystal layer 18 has been formed, a layer of control dielectric 20 is formed on top of the nanocrystal layer. In one embodiment, the layer of control dielectric 20 is formed by the deposition of one layer of oxide, one layer of nitride, and one layer of oxynitride (i.e., an ONO layer), where each of these layers is 40 Å thick.

In FIG. 3b, a first photoresist layer 22 is formed over the to-be-fabricated memory cell array 12 to protect the underlying layers 16, 18, 20 from fabrication steps carried out on the portion of the substrate 24 corresponding to the to-be-fabricated peripheral semiconductor device without nanocrystals. The mask layer is removed from the portion 24 of the to-be-fabricated peripheral semiconductor device 10 without nanocrystals shown in FIG. 3a.

In FIG. 4a, the control dielectric and nanocrystal layers are removed from the section 10 of the substrate 24 corresponding to the to-be-fabricated peripheral semiconductor device without nanocrystals. For example, a wet/dry etch removes the control dielectric and a wet etch removes the nanocrystal layer. In other embodiments, other processes known to those skilled in the art may be used to remove the dielectric and nanocrystal layers.

In FIG. 5b, the photo resistive mask layer is stripped. The underlying layers are cleaned using a known cleaning process such as SCI or SC2 and the gate oxide shown in FIGS. 5A and 5b is subject to a standard furnace treatment. After this step, the nanocrystal gate should have a targeted thickness of 50 Å (the targeted thickness may vary in other embodiments). (The original thickness of the control dielectric layer 20 will also increase and needs to be accounted for.)

In FIGS. 6a and 6b, a layer of polysilicon 28 is deposited over both portions 10, 12 of the substrate 24, 26. In FIGS. 7a and 7b, a second layer of photoresist 30 is applied to mask the portion of the substrate 24 corresponding to the to-be-fabricated peripheral semiconductor device 10 and part of the portion 12 of the substrate 26 associated with the to-be-fabricated memory cell, specifically, the cell transistor.

In FIG. 8b, the polysilicon layer 28 not protected by the photoresist layer 30 is etched away by a standard dry etch. In FIG. 8a, the polysilicon layer 28 is unaffected since it is protected by the second photoresist layer 30.

In FIG. 9b, the portion of the control dielectric layer 20 not protected by the second photoresist layer 30 is removed by a wet (dry) etch or a dry/wet etch. This exposes the underlying nanocrystal layer 18. In FIG. 9a, the portion 10 of the substrate 24 associated with the to-be-fabricated peripheral semiconductor device is unaffected due to the second photoresist layer 30.

In FIGS. 10a and 10b, the second photoresist layer is removed. In FIG. 11b, a second thermal oxide layer 32 is grown, consuming the exposed nanocrystals. Mechanisms for thermal oxide growth are well understood. About 44% of underlying silicon is consumed to form a thermal silicon dioxide. At standard ambient temperatures (e.g., 68° C.), thermal oxide will grow to about 1 nm (10 Å, known as "native oxide"), consuming about 0.44 nm (4.4 Å) of underlying silicon. By elevating a processing temperature, for example, in a rapid thermal processor or diffusion furnace, the exposed nanocrystals are entirely consumed. In one specific embodiment, an Applied Materials ISSG diluted wet oxidation oxide chamber is used with a temperature of about 800° C.–900° C. for 10–30 seconds. Therefore, the second thermal oxide 32 is comprised of consumed nanocrystals. In FIGS. 12a and 12b, an oxide etch completely removes the layer of oxide from the surface of areas where the source and drain will be formed.

Figure 14A:
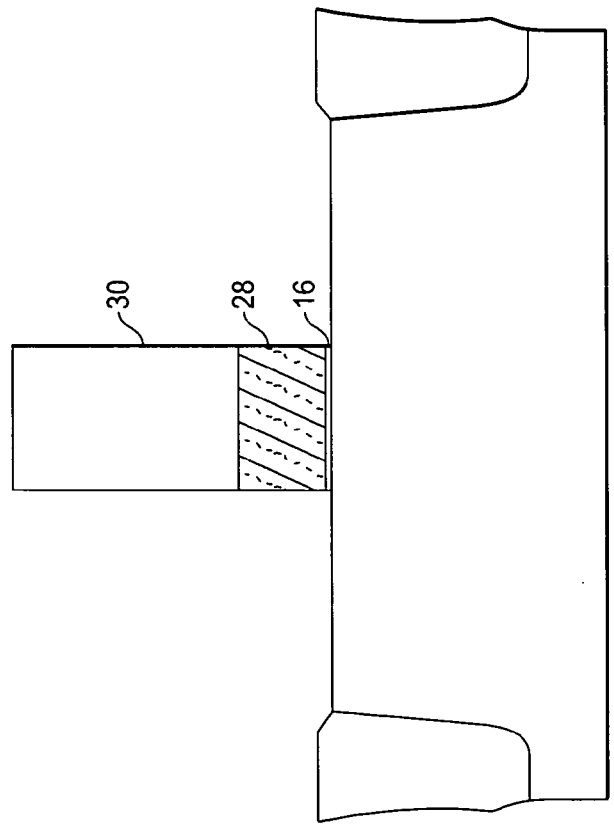
Figure 15A:
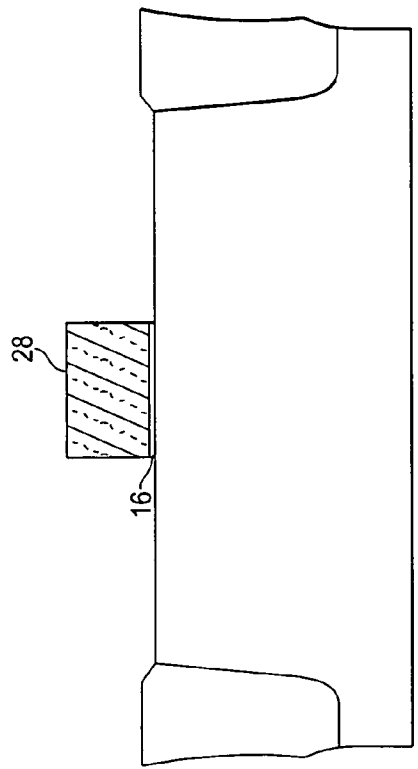
Figure 15B:
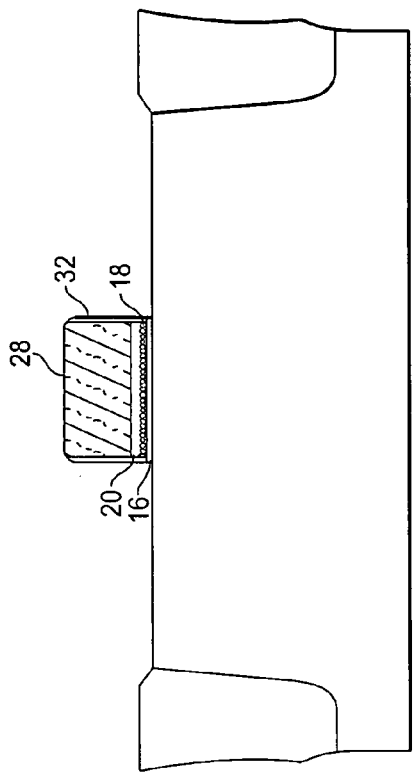

In FIG. 13a, a third layer of photoresist 60 is applied to mask the area 10 of the substrate 24 corresponding to the peripheral semiconductor device to be manufactured. In FIG. 13b, the third layer of photoresist 60 is applied over the entire area 12 of the substrate 24 associated with the to-be-manufactured memory cell. In FIG. 14a, the gate polysilicon 28 and tunnel oxide 16 are etched away except for the gate region protected by the photoresist 60. In FIG. 14b, the etching process has no effect due to the presence of the third photoresist layer 60. In FIGS. 15a and 15b, the third photoresist layer 60 is stripped.

Figure 16A:
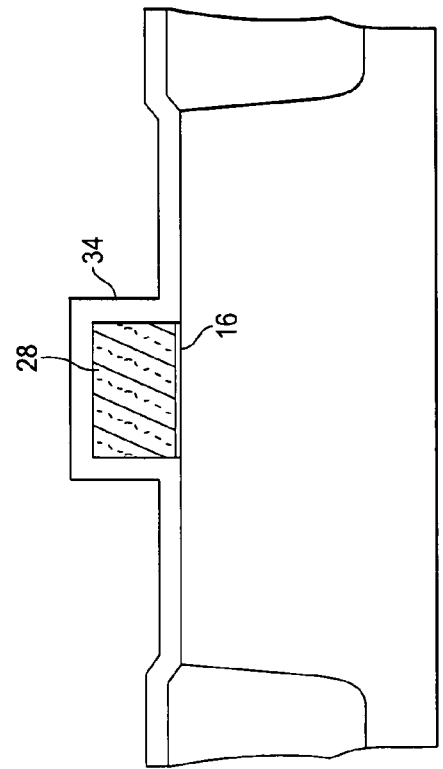
Figure 16B:
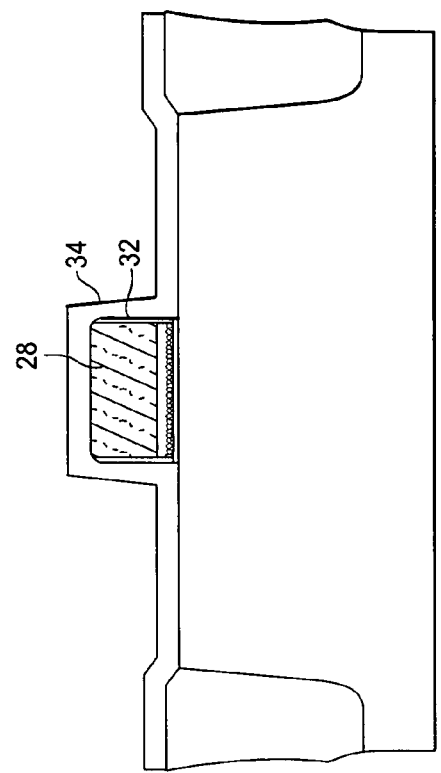
Figure 17A:
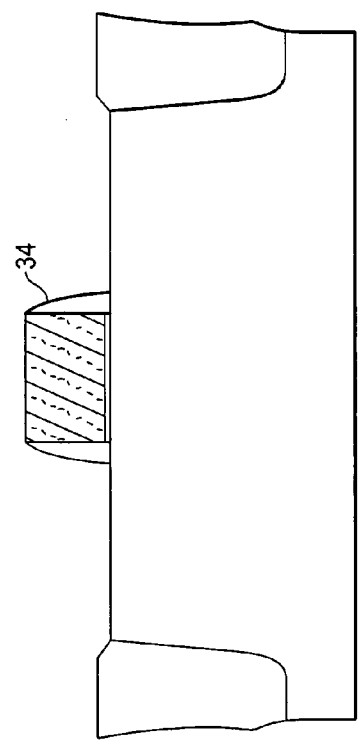
Figure 17B:
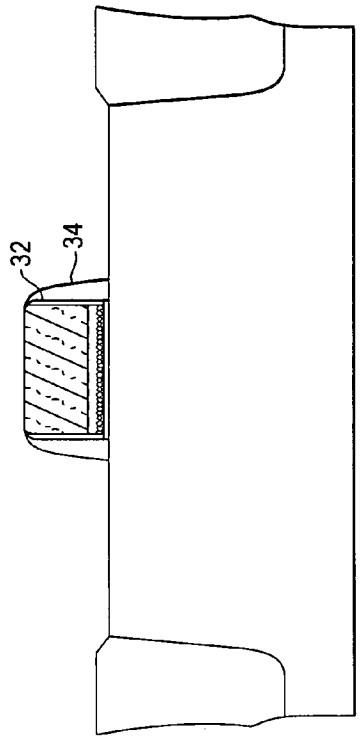

A temporary oxide spacer 34 is deposited in FIGS. 16a and 16b (by CVD or PECVD). In FIGS. 17a and 17b, the temporary spacer is removed by a dry etch process, leaving only a portion of the oxide spacer 34 on the sides of the peripheral device 10 and memory cell 12 being fabricated.

Figure 18A:
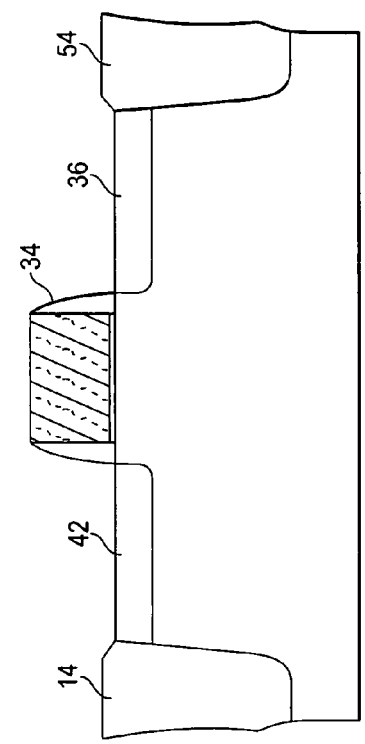
Figure 18B:
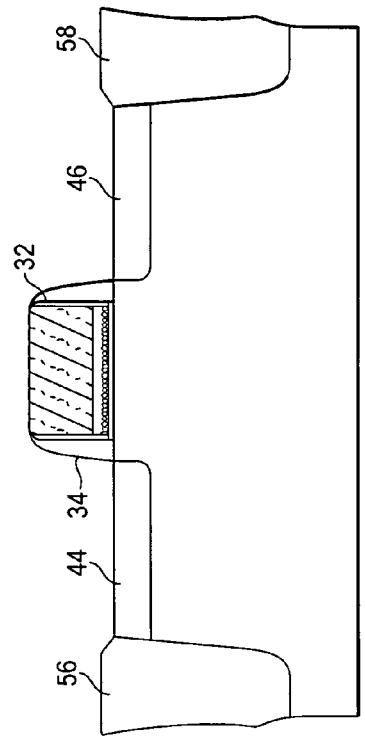

In FIGS. 18a and 18b, the source and drain regions 42, 36, 44, and 46 of the to-be-fabricated peripheral devices 10 and the to-be-fabricated memory cells 12, respectively, are formed by ion implantation (or diffusion in other embodiments). If dopants are implanted, a thermal annealing process is performed after implantation, in one embodiment, at 900° C.–1100° C. for typically 10 sec—several minutes. The temporary spacers are removed by a standard wet etch process in FIGS. 19a and 19b.

In FIGS. 20a and 20b, source/drain extensions 48, 38, 50, 52 (so called LDD) are implanted.

In FIGS. 21a and 21b, a nitride layer 40 is deposited. In FIGS. 22a and 22b, the nitride layer 40 is dry etched using a standard dry etch such that spacers 40 are formed on the sides of the gate stacks of both the peripheral device and memory cell structures 10, 12.

In the foregoing specification, the present invention has been described with reference to specific embodiments. It will, however, be evident to a skilled artisan that various changes and modifications can be made to these embodiments without departing from the broader spirit and scope of the present invention as set forth in the appended claims. The specification and drawings are, accordingly, to be regarded in an illustrative rather than a restrictive sense.

What is claimed is:

1. A method for simultaneously fabricating two semiconductor devices, at least one of which is a nanocrystal device and at least one of which is a non-nanocrystal device, comprising:
   a) forming a first thermal oxide layer for at least two semiconductor devices being fabricated on at least two portions of a surface of a substrate;
   b) forming a nanocrystal layer over the oxide layer of the at least two semiconductor devices being fabricated;
   c) removing with an etching process the nanocrystal layer from the at least one portion of the substrate corresponding to the at least one non-nanocrystal device being fabricated;
   d) forming a polycrystalline gate for each of the at least two semiconductor devices being fabricated, exposed nanocrystals not covered by the gate on the at least one portion of the substrate associated with the at least one nanocrystal device consumed by a thermal oxidation process, the thermal oxidation process producing a second thermal oxide, a remaining plurality of nanocrystals forming a floating gate;

e) providing doping in selected areas of the substrate to form source and drain regions for the at least two semiconductor devices being fabricated; and f) thermally treating the substrate following the doping, the thermal treatment not limiting a thermal budget of the fabrication process.

2. The method of claim 1 further comprising masking at least one portion of the substrate associated with the at least one nanocrystal device being fabricated to protect underlying layers while performing fabrication processes for the at least non-nanocrystal device being fabricated.

3. The method of claim 1 further comprising masking at least one portion of the substrate associated with the at least one non-nanocrystal device being fabricated to protect underlying layers while performing fabrication processes for the at least one nanocrystal device being fabricated.

4. The method of claim 1 further comprising forming a control dielectric layer on top of the nanocrystal layer.

5. The method of claim 1 further comprising forming oxide spacers for the semiconductor devices being fabricated on the substrate.

6. The method of claim 1 further comprising removing the oxide spacers for the semiconductor devices being fabricated on the semiconductor substrate.

7. The method of claim 1 further comprising forming nitride spacers for the semiconductor devices being fabricated on the semiconductor substrate.

8. The method of claim 1 wherein a CMOS transistor is formed.

9. The method of claim 1 wherein the substrate is a silicon wafer.

10. The method of claim 1 wherein the polycrystalline gate is comprised of polycrystalline silicon.

11. The method of claim 4 further comprising removing the control dielectric layer from the at least one non-nanocrystal device being fabricated with an etching process.

12. The method of claim 4 further comprising etching portions of the control layer dielectric that are not covered by the polycrystalline gate until a plurality of nanocrystals not located under the polycrystalline gate is exposed.

13. The method of claim 4 wherein the dielectric layer is essentially an ONO layer.

14. A method for simultaneously fabricating two semiconductor devices, at least one of which is a nanocrystal device and at least one of which is a non-nanocrystal device, comprising:

a) forming a first thermal oxide layer for at least two semiconductor devices being fabricated on at least two portions of a surface of a substrate;

b) forming a nanocrystal layer over the oxide layer of the at least two semiconductor devices being fabricated;

c) masking at least one portion of the substrate associated with the at least one nanocrystal device being fabricated to protect underlying layers while performing fabrication processes for the at least non-nanocrystal device being fabricated, said fabrication processes including removing with an etching process the nanocrystal layer from the at least one portion of the substrate corresponding to the at least one non-nanocrystal device being fabricated;

d) forming a polycrystalline gate for each of the at least two semiconductor devices being fabricated, the exposed nanocrystals not covered by the gate on the at least one portion of the substrate associated with the at least one nanocrystal device consumed by a thermal oxidation process, the thermal oxidation process producing a second thermal oxide, a remaining plurality of nanocrystals forming a floating gate;

e) providing doping in selected areas of the substrate to form source and drain regions for the at least two semiconductor devices being fabricated; and f) thermally treating the substrate following the doping, the thermal treatment not limiting a thermal budget of the fabrication process.

15. The method of claim 14 further comprising masking at least one portion of the substrate associated with the at least one non-nanocrystal device being fabricated to protect underlying layers while performing fabrication processes for the at least one nanocrystal device being fabricated.

16. The method of claim 14 further comprising forming a control dielectric layer on top of the nanocrystal layer.

17. The method of claim 14 further comprising forming oxide spacers for the semiconductor devices being fabricated on the substrate.

18. The method of claim 14 further comprising removing the oxide spacers for the semiconductor devices being fabricated on the semiconductor substrate.

19. The method of claim 14 further comprising forming nitride spacers for the semiconductor devices being fabricated on the semiconductor substrate.

20. The method of claim 14 wherein a CMOS transistor is formed.

21. The method of claim 14 wherein the substrate is a silicon wafer.

22. The method of claim 14 wherein the polycrystalline gate is comprised of polycrystalline silicon.

23. The method of claim 16 further comprising removing the control dielectric layer from the at least one non-nanocrystal device being fabricated with an etching process.

24. The method of claim 16 wherein the dielectric layer is essentially an ONO layer.

25. The method of claim 23 further comprising etching portions of the control layer dielectric that are not covered by the polycrystalline gate until a plurality of nanocrystals not located under the polycrystalline gate is exposed.

* * * * *